(12) United States Patent
Ikehara et al.

(10) Patent No.: US 12,015,040 B2
(45) Date of Patent: *Jun. 18, 2024

(54) SOLID-STATE IMAGING DEVICE, METHOD OF MANUFACTURING THE SAME, AND ELECTRONIC APPARATUS CAPABLE TO PROTECT A PHOTOELECTRIC CONVERSION FILM

(71) Applicant: SONY CORPORATION, Tokyo (JP)

(72) Inventors: Shigehiro Ikehara, Kanagawa (JP); Masahiro Joei, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 283 days.

This patent is subject to a terminal disclaimer.

(21) Appl. No.: 16/940,228

(22) Filed: Jul. 27, 2020

(65) Prior Publication Data

US 2021/0013254 A1    Jan. 14, 2021

Related U.S. Application Data

(63) Continuation of application No. 16/086,627, filed as application No. PCT/JP2017/010304 on Mar. 15, 2017, now Pat. No. 10,756,132.

(30) Foreign Application Priority Data

Mar. 29, 2016 (JP) ................. 2016-065608

(51) Int. Cl.
*H01L 27/146* (2006.01)
*H01L 21/02* (2006.01)
(Continued)

(52) U.S. Cl.
CPC .. *H01L 27/14623* (2013.01); *H01L 21/02274* (2013.01); *H01L 27/1462* (2013.01);
(Continued)

(58) Field of Classification Search
CPC ......... H01L 27/14623; H01L 21/02274; H01L 27/1462; H01L 27/1464; H01L 27/14645;
(Continued)

(56) References Cited

U.S. PATENT DOCUMENTS

2002/0060322 A1  5/2002  Tanabe et al.
2007/0034981 A1  2/2007  Saito
(Continued)

FOREIGN PATENT DOCUMENTS

CN  104396018 A  3/2015
CN  105308749 A  2/2016
(Continued)

OTHER PUBLICATIONS

Non-Final Office Action for U.S. Appl. No. 16/086,627, dated Jun. 27, 2019, 12 pages.
(Continued)

*Primary Examiner* — Nilufa Rahim
(74) *Attorney, Agent, or Firm* — CHIP LAW GROUP

(57) ABSTRACT

The present technology relates to a solid-state imaging device capable of protecting a photoelectric conversion film with a sealing film that has excellent sealing properties and coverage, a method of manufacturing the solid-state imaging device, and an electronic apparatus. A solid-state imaging device includes: a photoelectric conversion film formed on the upper side of a semiconductor substrate; and a sealing film that is formed on the upper layer of the photoelectric conversion film and has a lower etching rate than that of silicon oxide. The present technology can be applied to solid-state imaging devices having a photoelectric conversion film on the upper side of a semiconductor substrate, and the like, for example.

11 Claims, 11 Drawing Sheets

(51) Int. Cl.
  *H01L 31/0216* (2014.01)
  *H04N 25/76* (2023.01)
  *H10K 30/88* (2023.01)
  *H10K 39/32* (2023.01)

(52) U.S. Cl.
  CPC .... *H01L 27/1464* (2013.01); *H01L 27/14645* (2013.01); *H01L 27/14665* (2013.01); *H01L 31/02162* (2013.01); *H04N 25/76* (2023.01); *H10K 30/88* (2023.02); *H01L 27/14638* (2013.01); *H10K 39/32* (2023.02)

(58) Field of Classification Search
  CPC ......... H01L 27/14665; H01L 31/02162; H01L 51/448; H01L 27/14638; H01L 27/307; H04N 5/374; Y02E 10/549
  See application file for complete search history.

(56) References Cited

U.S. PATENT DOCUMENTS

| | | |
|---|---|---|
| 2007/0278606 A1 | 12/2007 | Sasagawa et al. |
| 2013/0020468 A1 | 1/2013 | Mitsuhashi et al. |
| 2014/0367668 A1 | 12/2014 | Fujii et al. |
| 2015/0060839 A1 | 3/2015 | Suzuki |
| 2015/0171137 A1* | 6/2015 | Kawano ............ H01L 27/14638 438/57 |
| 2015/0194469 A1 | 7/2015 | Joei |
| 2015/0214267 A1* | 7/2015 | Chen .................. H01L 27/1462 438/57 |
| 2016/0061655 A1* | 3/2016 | Nozawa ................ G01J 1/0407 250/578.1 |
| 2016/0118434 A1* | 4/2016 | Chang ............... H01L 27/14643 438/72 |
| 2016/0307952 A1* | 10/2016 | Huang ................ H01L 27/1464 |
| 2016/0372520 A1 | 12/2016 | Joei |
| 2017/0148843 A1* | 5/2017 | Mori ................ H01L 27/14663 |
| 2017/0236856 A1* | 8/2017 | Tomiyasu ......... H01L 27/14663 378/91 |
| 2019/0103431 A1 | 4/2019 | Murata |

FOREIGN PATENT DOCUMENTS

| | | |
|---|---|---|
| JP | 08-088341 A | 4/1996 |
| JP | 2003-332551 A | 11/2003 |
| JP | 2005-150770 A | 6/2005 |
| JP | 2008-252004 A | 10/2008 |
| JP | 2011-029337 A | 2/2011 |
| JP | 2011-097079 A | 5/2011 |
| JP | 2012-094718 A | 5/2012 |
| JP | 2013-026329 A | 2/2013 |
| JP | 2013-236008 A | 11/2013 |
| JP | 2014-165332 A | 9/2014 |
| JP | 2014-229854 A | 12/2014 |
| JP | 2015-015332 A | 1/2015 |
| KR | 10-2016-0030102 A | 3/2016 |
| TW | 201403804 A | 1/2014 |
| TW | 201505168 A | 2/2015 |
| WO | 2013/168399 A1 | 11/2013 |
| WO | 2014/007132 A1 | 1/2014 |
| WO | 2014/192274 A1 | 12/2014 |
| WO | 2015/001771 A1 | 1/2015 |

OTHER PUBLICATIONS

Non-Final Office Action for U.S. Appl. No. 16/086,627, dated Jan. 29, 2020, 14 pages.
Final Office Action for U.S. Appl. No. 16/086,627, dated Oct. 18, 2019, 11 pages.
Advisory Action for U.S. Appl. No. 16/086,627, dated Dec. 20, 2019, 03 pages.
Notice of Allowance for U.S. Appl. No. 16/086,627, dated Apr. 27, 2020, 09 pages.
International Search Report and Written Opinion of PCT Application No. PCT/JP2017/010304, dated May 9, 2017, 10 pages of English Translation and 08 pages of ISRWO.
International Preliminary Report on Patentability of PCT Application No. PCT/JP2017/010304, dated Oct. 11, 2018, 10 pages of English Translation and 05 pages of IPRP.

* cited by examiner

SOLID-STATE IMAGING DEVICE, METHOD OF MANUFACTURING THE SAME, AND ELECTRONIC APPARATUS CAPABLE TO PROTECT A PHOTOELECTRIC CONVERSION FILM

This application is a continuation application of U.S. patent application Ser. No. 16/086,627, filed on Sep. 20, 2018, which is a U.S. National Phase of International Patent Application No. PCT/JP2017/010304 filed on Mar. 15, 2017, which claims priority benefit of Japanese Patent Application No. JP 2016-065608 filed in the Japan Patent Office on Mar. 29, 2016. Each of the above-referenced applications is hereby incorporated herein by reference in its entirety.

TECHNICAL FIELD

The present technology relates to a solid-state imaging device, a method of manufacturing the solid-state imaging device, and an electronic apparatus, and more particularly, to a solid-state imaging device capable of protecting a photoelectric conversion film with a sealing film that has excellent sealing properties and coverage, a method of manufacturing the solid-state imaging device, and an electronic apparatus.

BACKGROUND ART

In CCD image sensors and CMOS image sensors, the number of photons that enter a unit pixel decreases as the pixel size becomes smaller. As a result, the sensitivity becomes lower, and the S/N ratio also becomes lower. Further, in an image sensor having a pixel array in which pixels to receive red, green, and blue light are arranged in a plane, such as the Bayer array that involves primary color filters and is widely used today, green and blue light does not pass through the color filters in the red pixels, and cannot be used in photoelectric conversion. As a result, loss is caused in terms of sensitivity. Further, false colors are also generated, as interpolation processing between pixels is performed to create color signals.

As a method for solving those problems, there are known image sensors in which three photoelectric conversion layers are stacked in the vertical direction to obtain photoelectric conversion signals of three colors with one pixel. As such a structure in which photoelectric conversion layers of three colors are stacked for one pixel, for example, there is a suggested sensor in which a photoelectric conversion unit that detects green light and generates a signal charge corresponding to the detected green light is provided above a silicon substrate, and blue light and red light is detected with two PDs stacked in the silicon substrate (Patent Document 1, for example).

There also is a suggested back-illuminated solid-state imaging device in which the circuit formation surface is formed on the opposite side from the light receiving surface in a structure in which an organic photoelectric conversion film (a photoelectric conversion unit) that photoelectrically converts light of one color is provided above a silicon substrate, and a two-layer photoelectric conversion unit that photoelectrically converts light of two colors are provided in the silicon substrate (Patent Document 2, for example). In a case where a three-layer photoelectric conversion unit is formed in a back-illuminated structure, circuits, wiring lines, and the like are not formed between an inorganic photoelectric conversion unit and an organic photoelectric conversion unit, so that the inorganic photoelectric conversion unit and the organic photoelectric conversion unit in the same pixel can be made closer to each other. Accordingly, the dependence of each color on the F value can be reduced, and variation of sensitivity among the respective colors can be reduced.

Since an organic photoelectric conversion film provided above a silicon substrate is easily damaged by moisture, oxygen, or the like during and after the manufacturing, there is a need for a sealing film that protects the organic photoelectric conversion film. In a structure in which a photoelectric conversion unit is formed by stacking a lower electrode, an organic photoelectric conversion film, and an upper electrode in this order on a silicon substrate, it is necessary to protect the upper electrode and the side walls thereof with a sealing film. In particular, at the side wall portions, the organic photoelectric conversion film is exposed to separate the upper electrode and the lower electrode from each other, and therefore, protection with a sealing film is critical.

In Patent Document 3, AlO according to an ALD method is formed as a sealing film having excellent protection characteristics on the upper electrode. Further, Patent Document 4 suggests protection of the top portion and the side walls of an organic photoelectric conversion film with a sealing film containing silicon nitride as a principal component.

CITATION LIST

Patent Documents

Patent Document 1: Japanese Patent Application Laid-Open No. 2003-332551
Patent Document 2: Japanese Patent Application Laid-Open No. 2011-29337
Patent Document 3: Japanese Patent Application Laid-Open No. 2008-252004
Patent Document 4: Japanese Patent Application Laid-Open No. 2011-97079

SUMMARY OF THE INVENTION

Problems to be Solved by the Invention

However, with the technique disclosed in Patent Document 3, there is a possibility that the organic photoelectric conversion film is damaged at the time of manufacturing due to the gas (mainly ozone gas) used at the time of film formation by a chemical vapor deposition method (CVD method). Therefore, in Patent Document 3, a silicon nitride film is formed as a first protective film on the organic photoelectric conversion film by a physical vapor deposition method (PVD method), but a protective film formed by the PVD method has poor sealing properties.

Further, in a case where protection is realized with a sealing film containing silicon nitride as a principal component as in Patent Document 4, the sealing film is normally formed by a PVD method or a CVD method. However, in a case where a silicon nitride film or the like is formed by a conventional PVD or CVD method, seams are formed at the steps at the end portions of the organic photoelectric conversion film. This is because a sealing film formed by a conventional PVD or CVD method has low coverage. Further, due to the existence of the seams, water molecules and the like enter from the outside, and then reach the organic photoelectric conversion film, resulting in performance degradation after the manufacture.

The present technology has been made in view of those circumstances, and is to protect a photoelectric conversion film with a sealing film that has excellent sealing properties and coverage.

Solutions to Problems

A solid-state imaging device of a first aspect of the present technology includes: a photoelectric conversion film formed on the upper side of a semiconductor substrate; and a first sealing film that is formed on the upper layer of the photoelectric conversion film and has a lower etching rate than that of silicon oxide.

A method of manufacturing a solid-state imaging device of a second aspect of the present technology includes: forming a photoelectric conversion film on the upper side of a semiconductor substrate; and forming a sealing film on the upper layer of the photoelectric conversion film by a remote plasma CVD method.

An electronic apparatus of a third aspect of the present technology includes a solid-state imaging device that includes: a photoelectric conversion film formed on the upper side of a semiconductor substrate; and a sealing film that is formed on the upper layer of the photoelectric conversion film and has a lower etching rate than that of silicon oxide.

In the first through third aspects of the present technology, a photoelectric conversion film is formed on the upper side of a semiconductor substrate, and a sealing film is formed on the upper layer of the photoelectric conversion film.

The solid-state imaging device and the electronic apparatus may be independent devices, or may be modules to be incorporated into other devices.

Effects of the Invention

According to the first through third aspects of the present technology, it is possible to protect a photoelectric conversion film with a sealing film that has excellent sealing properties and coverage.

Note that the effects of the present technology are not limited to the effects described herein, and may include any of the effects described in the present disclosure.

MODES FOR CARRYING OUT THE INVENTION

Figure 1:
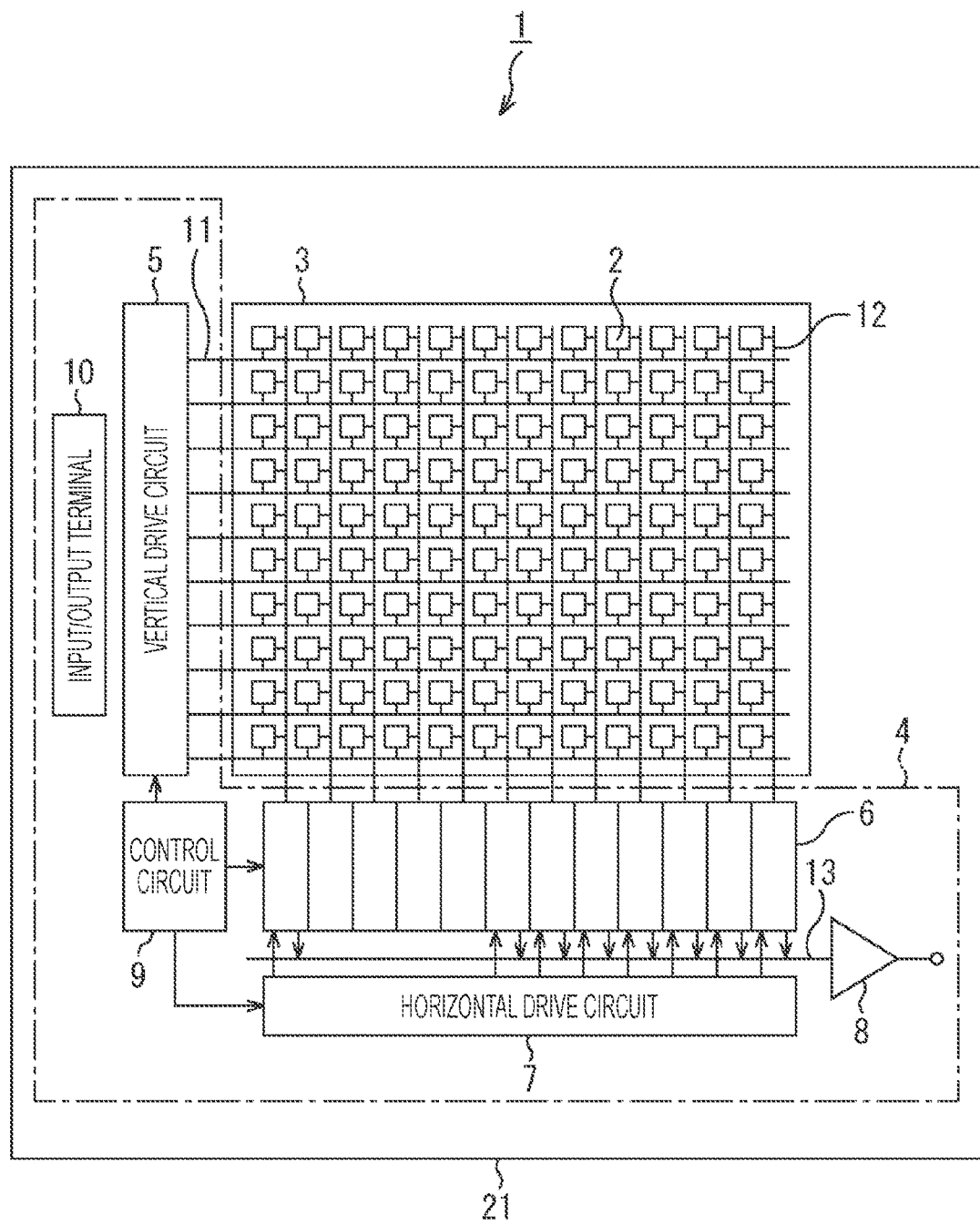
FIG. 1 is a diagram showing a general configuration of a solid-state imaging device to which present technology is applied.

The following is a description of modes for carrying out the present technology (these modes will be hereinafter referred to as embodiments). Note that the description will be made in the following order.
1. General example configuration of a solid-state imaging device
2. First embodiment of a solid-state imaging device
3. Second embodiment of a solid-state imaging device
4. Third embodiment of a solid-state imaging device
5. Fourth embodiment of a solid-state imaging device
6. Example applications to electronic apparatuses 1. General Example Configuration of a Solid-State Imaging Device FIG. 1 schematically shows the configuration of a solid-state imaging device to which present technology is applied.

The solid-state imaging device 1 shown in FIG. 1 includes a pixel array unit 3 having pixels 2 arranged in a two-dimensional array on a semiconductor substrate 21 using silicon (Si) as the semiconductor, for example, and a peripheral circuit unit 4 existing around the pixel array unit 3. The peripheral circuit unit 4 includes a vertical drive circuit 5, column signal processing circuits 6, a horizontal drive circuit 7, an output circuit 8, a control circuit 9, and the like.

Each pixel 2 includes a photoelectric conversion unit that photoelectrically converts incident light, and a plurality of pixel transistors. The plurality of pixel transistors are formed with four MOS transistors: a transfer transistor, a select transistor, a reset transistor, and an amplification transistor.

The control circuit 9 receives an input clock and data that designates an operation mode and the like, and also outputs data such as internal information about the solid-state imaging device 1. Specifically, in accordance with a vertical synchronization signal, a horizontal synchronization signal, and a master clock, the control circuit 9 generates a clock signal and a control signal that serve as the references for operations of the vertical drive circuit 5, the column signal processing circuits 6, the horizontal drive circuit 7, and the like. The control circuit 9 then outputs the generated clock signal and control signal to the vertical drive circuit 5, the column signal processing circuits 6, the horizontal drive circuit 7, and the like.

The vertical drive circuit 5 is formed with a shift register, for example, selects a predetermined pixel drive line 11, supplies a pulse for driving the pixels 2 to the selected pixel drive line 11, and drives the pixels 2 on a row-by-row basis. Specifically, the vertical drive circuit 5 sequentially selects and scans the respective pixels 2 of the pixel array unit 3 on a row-by-row basis in the vertical direction, and supplies pixel signals based on the signal charges generated in accordance with the amounts of light received in the photoelectric conversion units of the respective pixels 2, to the column signal processing circuits 6 through vertical signal lines 12.

The column signal processing circuits 6 are provided for the respective columns of the pixels 2, and perform signal processing such as denoising, on a column-by-column basis, on signals that are output from the pixels 2 of one row. For example, the column signal processing circuits 6 perform signal processing such as correlated double sampling (CDS) for removing fixed pattern noise inherent to pixels, and AD conversion.

The horizontal drive circuit 7 is formed with a shift register, for example. The horizontal drive circuit 7 sequentially selects the respective column signal processing circuits 6 by sequentially outputting horizontal scan pulses, and causes the respective column signal processing circuits 6 to output pixel signals to a horizontal signal line 13.

The output circuit 8 performs signal processing on signals sequentially supplied from the respective column signal processing circuits 6 through the horizontal signal line 13, and outputs the processed signals. The output circuit 8 might perform only buffering, or might perform black level control, column variation correction, various kinds of digital signal processing and the like, for example. An input/output terminal 10 exchanges signals with the outside.

The solid-state imaging device 1 having the above configuration is a so-called column AD-type CMOS image sensor in which the column signal processing circuits 6 that perform CDS processes and AD conversion processes are provided for the respective pixel columns.

2. First Embodiment of a Solid-State Imaging Device

Figure 2:
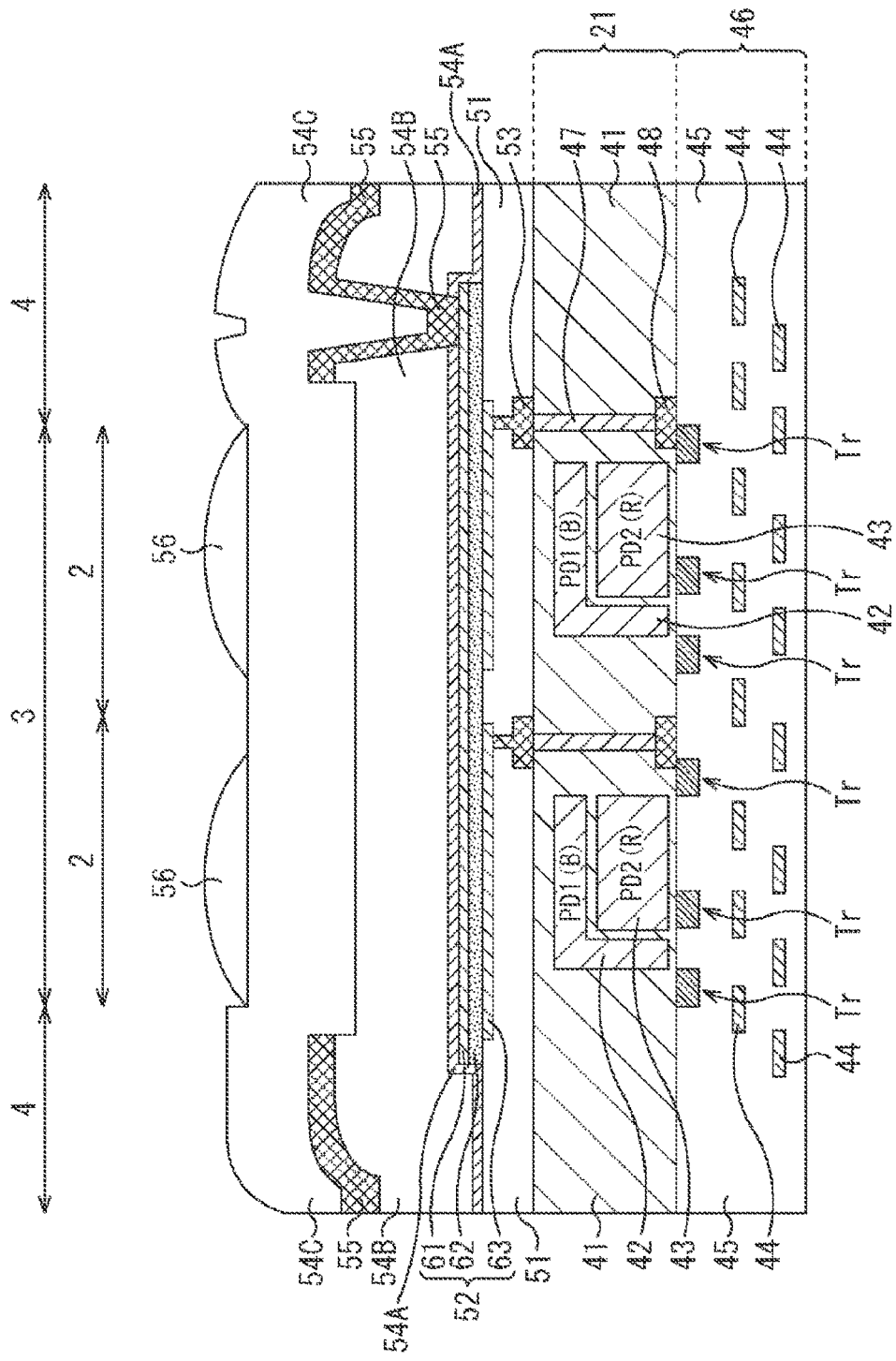
FIG. 2 is a diagram showing an example cross-sectional configuration according to a first embodiment of a solid-state imaging device.

FIG. 2 is a diagram showing an example cross-sectional configuration according to a first embodiment of a solid-state imaging device 1.

Note that the pixel array unit 3 shown in FIG. 2 is a pixel cross-sectional structure of two pixels due to space limitation.

The semiconductor substrate 21 is formed with a semiconductor region 41 of a first conductivity type (the P-type, for example) and semiconductor regions 42 and 43 of a second conductivity type (the N-type, for example). As the semiconductor regions 42 and 43 of the second conductivity type are stacked in the depth direction on a pixel-by-pixel basis in the semiconductor region 41 of the first conductivity type, photodiodes PD1 and PD2 are formed with PN junctions in the depth direction. The photodiode PD1 having the semiconductor region 42 as the charge accumulation region is a photoelectric conversion unit that receives blue light and performs photoelectric conversion, and the photodiode PD2 having the semiconductor region 43 as the charge accumulation region is a photoelectric conversion unit that receives red light and performs photoelectric conversion.

A multilayer wiring layer 46 formed with a plurality of pixel transistors Tr that perform reading of charges accumulated in the photodiodes PD1 and PD2, and the like, a plurality of wiring layers 44, and an interlayer insulating film 45 is formed on the front surface side of the semiconductor substrate 21, which is the lower side in FIG. 2.

On the other hand, a photoelectric conversion unit 52 is formed on the back surface side of the semiconductor substrate 21, which is the upper side in FIG. 2, via a transparent insulating film 51. The photoelectric conversion unit 52 is formed by stacking an upper electrode 61, a photoelectric conversion film 62, and a lower electrode 63, and the photoelectric conversion film 62 is interposed between the upper electrode 61 and the lower electrode 63. The upper electrode 61 is formed to be shared by all the pixels of the pixel array unit 3, and the lower electrode 63 is formed separately for each pixel of the pixel array unit 3.

The transparent insulating film 51 is formed with one or a plurality of layers using materials such as silicon oxide ($SiO_2$), silicon nitride (SiN), silicon oxynitride (SiON), or hafnium oxide ($HfO_2$), for example. To reduce the interface level with the semiconductor substrate 21 and prevent generation of dark current from the interface on the back surface side of the semiconductor substrate 21, the transparent insulating film 51 preferably has a low interface level.

A transparent conductive material such as indium tin oxide (ITO), for example, is used as the material of the upper electrode 61 and the lower electrode 63. Note that the material of the upper electrode 61 and the lower electrode 63 is not necessarily ITO, but can be $SnO_2$ (having a dopant added thereto) based on tin oxide, and as a zinc oxide-based material, aluminum zinc oxide (AZO, for example, with Al as a dopant added to ZnO), gallium zinc oxide (GZO, for example, with Ga as a dopant added to ZnO), indium zinc oxide (IZO, for example, with In as a dopant added to ZnO), IGZO, CuI, $InSbO_4$, ZnMgO, $CuInO_2$, $MgIn_2O_4$, CdO, $ZnSnO_3$, or the like. The upper electrode 61 and the lower electrode 63 are designed to have a thickness of about 50 nm, for example.

The photoelectric conversion film 62 receives green light, and performs photoelectric conversion. In the photoelectric conversion film 62, an example of the material sensitive only to green light is a combination of organic materials that are a quinacridone compound (an electron-donating material) and a perylene compound (an electron-accepting material), for example. The photoelectric conversion film 62 is designed to have a thickness of about 150 nm, for example.

The photoelectric conversion film 62 should include at least one of an organic p-type semiconductor and an organic n-type semiconductor, but preferably has a pin bulk hetero structure that includes a p-type blocking layer, p-type and n-type codeposited layers, and an n-type blocking layer.

A quinacridone derivative, a naphthalene derivative, an anthracene derivative, a phenanthrene derivative, a tetracene derivative, a pyrene derivative, a perylene derivative, or a fluoranthene derivative is particularly preferable as each of the organic p-type semiconductor and the organic n-type semiconductor. Further, it is possible to use a polymer such as phenylenevinylene, fluorene, carbazole, indole, pyrene, pyrrole, picoline, thiophene, acetylene, or diacetylene, or a derivative of such a polymer. Moreover, it is possible to use any of the following materials in a preferred manner: condensed polycyclic aromatics such as a metal complex dye, a cyanine dye, a merocyanine dye, a phenylxanthene dye, a triphenylmethane dye, a rhodacyanine dye, a xanthene dye, a macrocyclic azaanuren dye, an azulene dye, naphthoquinone, an anthraquinone dye, anthracene, and pyrene; chain compounds in which an aromatic ring or a heterocyclic compound is condensed; two nitrogen-containing heterocyclic rings such as quinoline, benzothiazole, and benzoxazole, which have a squarylium group and a croconic methine group as a bonding chain; cyanine-based dyes bonded by a squarylium group and a croconic methine group; and the like. The metal complex dye described above is preferably a dithiol metal complex dye, a metal phthalocyanine dye, a metal porphyrin dye, a ruthenium complex dye, or the like, and a ruthenium complex dye is particularly preferable. Note that the above examples do not exclude materials that are not mentioned above.

In the photoelectric conversion unit 52, a charge blocking film, a charge buffering film, a work function adjustment film, and the like may be stacked, in addition to the upper electrode 61, the photoelectric conversion film 62, and the lower electrode 63. For example, an electron blocking film, and an electron blocking and buffering film are inserted between the upper electrode 61 and the photoelectric conversion film 62, and a hole blocking film, a hole blocking and buffering film, a work function adjustment film, and the like are inserted between the photoelectric conversion film 62 and the upper electrode 61.

The lower electrode 63 is connected to metal wiring lines 53 penetrating the transparent insulating film 51, and the metal wiring lines 53 are connected to conductive plugs 47 penetrating the semiconductor region 41 of the semiconductor substrate 21. The metal wiring lines 53 are formed with a material, such as tungsten (W), titanium (Ti), aluminum (Al), or copper (Cu). The metal wiring lines 53 also function as inter-pixel light shielding films.

The conductive plugs 47 are connected to charge accumulation portions 48 formed in a semiconductor region of the second conductivity type (the N-type, for example) in the vicinity of the interface on the front surface side of the semiconductor region 41. Note that, although not shown in the drawings, the outer circumferences of the conductive plugs 47 are insulated with an insulating film of SiO2, SiN, or the like.

The electric charges generated through photoelectric conversion in the photoelectric conversion unit 52 are transferred to the charge accumulation portions 48 via the metal wiring lines 53 and the conductive plugs 47. The charge accumulation portions 48 temporarily accumulate the electric charges photoelectrically converted by the photoelectric conversion unit 52, until the electric charges are read out.

Sealing films (protective films) 54 are formed on the upper side of the upper electrode 61 of the pixel array unit 3 and on the upper side of the transparent insulating film 51 of the peripheral circuit unit 4. In the first embodiment shown in FIG. 2, the sealing film 54 is formed with three layers: a first sealing film 54A, a second sealing film 54B, and a third sealing film 54C. A light shielding film 55 is further formed between the second sealing film 54B and the third sealing film 54C of the peripheral circuit unit 4.

The first sealing film 54A, the second sealing film 54B, and the third sealing film 54C include an inorganic material having optical transparency, and is formed with silicon carbide oxide (SiCO), silicon carbide nitride (SiCN), silicon nitride (SiN), silicon carbide nitride (SiON), aluminum oxide (AlO), aluminum nitride (AlN), or the like, for example. Note that each of the first sealing film 54A, the second sealing film 54B, and the third sealing film 54C is not necessarily a single-layer film, and may be a multilayer film formed with a combination of two or more of the above mentioned types of films.

A CVD method or an atomic layer deposition method (ALD method) is used as the method of forming the sealing film 54. In particular, the first sealing film 54A that protects the upper electrode 61 and the photoelectric conversion film 62 of the photoelectric conversion unit 52 is preferably formed by a remote plasma CVD method. Further, the material of the first sealing film 54A is preferably silicon carbide oxide (SiCO). A silicon carbide oxide film formed by the remote plasma CVD method generally has good coverage, and any seam is not formed at any step portion. Thus, entry of water molecules and the like from the outside can be effectively prevented. Furthermore, compared to the CVD and ALD methods using plasma other than the remote plasma CVD method, the remote plasma CVD method involves smaller irradiation amounts of high energy charged species (ions, electrons) and UV light, and can perform processes not using any oxidizing gas. Thus, damage to the photoelectric conversion film 62 can be reduced.

Where the silicon carbide oxide film formed as the first sealing film 54A by the remote plasma CVD method is compared with the silicon oxide (SiO2) film formed as the transparent insulating film 51 under the first sealing film 54A, for example, the silicon oxide (SiO2) film has the lower etching rate with diluted hydrofluoric acid (DHF, HF:H2O=1:100). On the other hand, the etching rate of the silicon nitride (SiN) film formed as the second sealing film 54B by a CVD method other than the remote plasma CVD method is higher than that of silicon oxide (SiO2).

As shown in FIG. 2, the light shielding film 55 formed between the second sealing film 54B and the third sealing film 54C is connected to the upper electrode 61 at a predetermined position of the peripheral circuit unit 4, and also serves as a metal wiring line for applying a predetermined bias voltage to the upper electrode 61. A material having low transmittance with respect to visible light such as tungsten (W), titanium (Ti), aluminum (Al), or copper (Cu), for example, is used as the material of the light shielding film 55.

In the pixel array unit 3, on-chip lenses 56 for the respective pixels are formed on the third sealing film 54C. Silicon nitride (SiN), or a resin material such as a styrene resin, an acrylic resin, a styrene-acrylic copolymer resin, or a siloxane resin, for example, is used as the material of the on-chip lenses 56. The third sealing film 54C and the on-chip lenses 56 can be formed with the same material.

The solid-state imaging device 1 formed as described above is a back-illuminated CMOS solid-state imaging device in which light enters from the back surface side on the opposite side from the front surface side of the semiconductor substrate 21 having the pixel transistors Tr formed thereon.

Manufacturing Method

Referring now to FIGS. 3A, 3B, 3C, 4A, 4B, 4C, 5A, 5B, and 5C, a method of manufacturing the solid-state imaging device 1 according to the first embodiment shown in FIG. 2 is described. Note that, in FIGS. 3A, 3B, 3C, 4A, 4B, 4C, 5A, 5B, and 5C, some of the reference numerals are not shown for easier viewing.

Figure 3A:
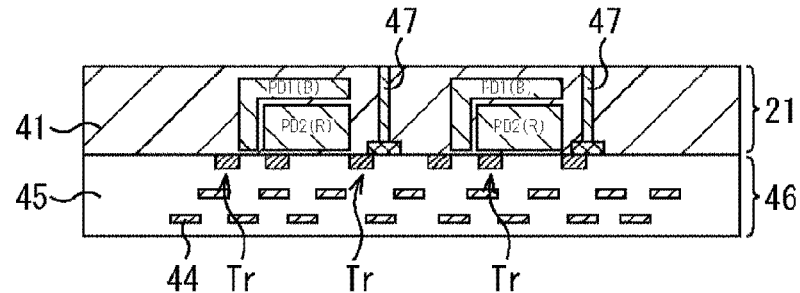
FIGS. 3A, 3B, and 3C are diagrams for explaining a method of manufacturing the solid-state imaging device according to the first embodiment.

First, as shown in FIG. 3A, after the photodiodes PD1 and PD2, the conductive plugs 47, and the like are formed in a predetermined region of the semiconductor substrate 21 on a pixel-by-pixel basis, the multilayer wiring layer 46 including the plurality of pixel transistors Tr is formed on the front surface side of the semiconductor substrate 21.

Figure 3B:
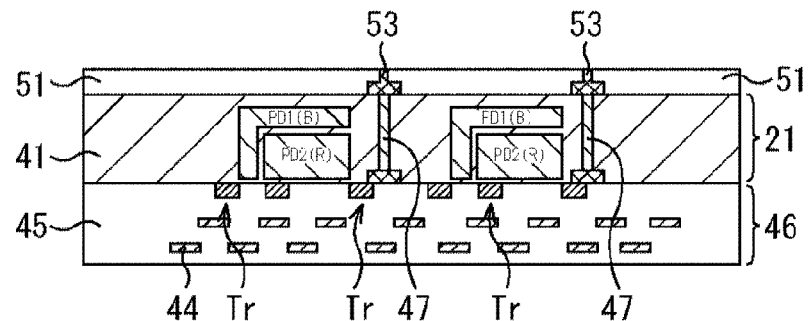

Next, as shown in FIG. 3B, the transparent insulating film 51 and the metal wiring lines 53 also functioning as inter-pixel light shielding films are formed on the back surface side of the semiconductor substrate 21. In this embodiment, the transparent insulating film 51 is formed with a stack structure of a hafnium oxide (HfO2) film formed by an ALD method and an SiO2 film formed by a plasma CVD method. For example, a film stack of titanium (Ti) and titanium nitride (TiN) as a barrier metal and a tungsten (W) film are formed as the metal wiring lines 53.

Figure 3C:
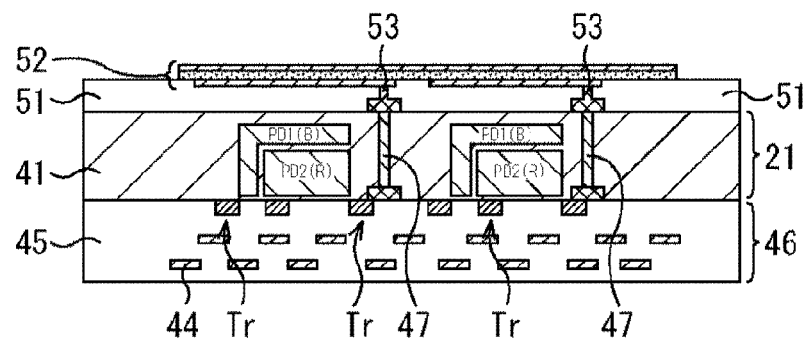

Next, as shown in FIG. 3C, the lower electrode 63, the photoelectric conversion film 62, and the upper electrode 61, which are to form the photoelectric conversion unit 52, are formed in that order.

After a film of a transparent conductive material such as ITO is formed by a sputtering technique, for example, patterning is performed by a photolithography technique, and processing is performed by dry etching or wet etching on a pixel-by-pixel basis. Thus, the lower electrode 63 is formed. The transparent insulating film 51 is then formed between the lower electrodes 63 by a plasma CVD method, for example. After that, the entire upper surfaces of the lower electrode 63 and the transparent insulating film 51 are flattened by CMP or the like.

The photoelectric conversion film 62 is formed by a vacuum deposition method, for example. It is generally known that the photoelectric conversion film 62 including an organic material greatly varies in characteristics due to the influence of moisture, oxygen, hydrogen, or the like. Therefore, it is desirable that the photoelectric conversion film 62 and the upper electrode 61 are formed in a consistent vacuum.

After the upper electrode 61 and the photoelectric conversion film 62 are formed in a consistent vacuum, patterning is performed by a photolithography technique, and the portions of the upper electrode 61 and the photoelectric conversion film 62 located at the peripheral portion of the peripheral circuit unit 4 are removed by dry etching.

Note that the patterning of the upper electrode 61 and the photoelectric conversion film 62 may be performed by a method using a shadow mask or the like, other than a method using a photolithography technique and a dry etching method. Further, the photoelectric conversion film 62 can also be formed by a coating method, for example.

Figure 4A:
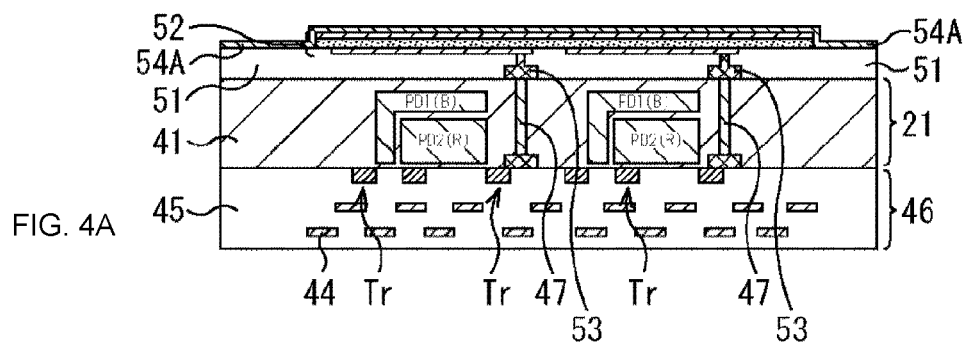
FIGS. 4A, 4B, and 4C are diagrams for explaining a method of manufacturing the solid-state imaging device according to the first embodiment.

Next, as shown in FIG. 4A, the first sealing film 54A is formed on the upper side of the upper electrode 61 of the photoelectric conversion unit 52 and on the upper side of the transparent insulating film 51 of the peripheral circuit unit 4. As described above, the first sealing film 54A is formed with silicon carbide oxide (SiCO) formed by a remote plasma CVD method.

Figure 4B:
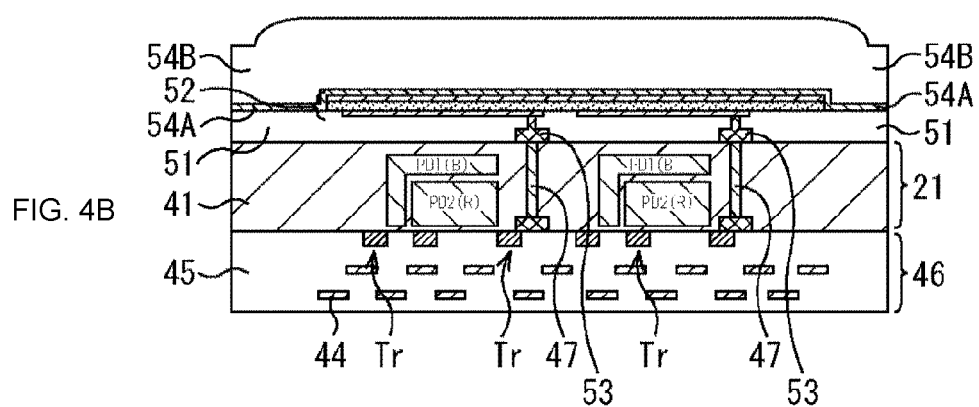
Figure 4C:
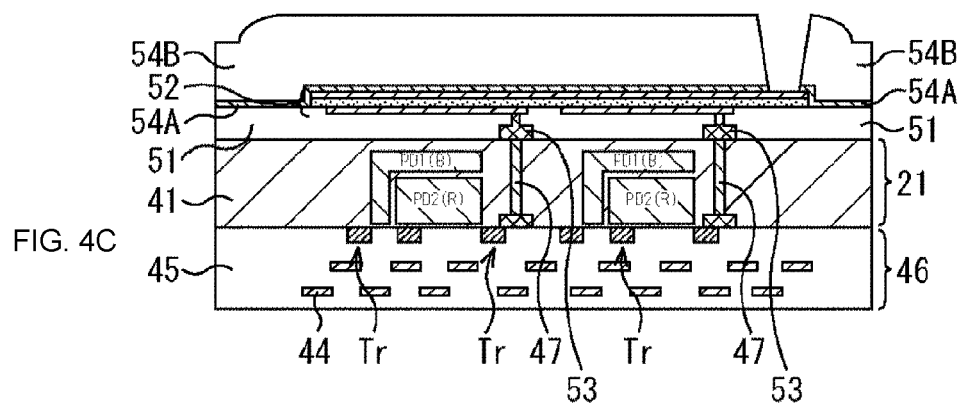

Next, as shown in FIG. 4B, the second sealing film 54B is formed on the first sealing film 54A. After that, as shown in FIG. 4C, the first sealing film 54A and the second sealing film 54B at a predetermined position in the peripheral circuit unit 4 are removed until the upper electrode 61 is exposed. The second sealing film 54B is silicon nitride (SiN) formed by a CVD method or an ALD method other than the remote plasma CVD method, for example.

Figure 5A:
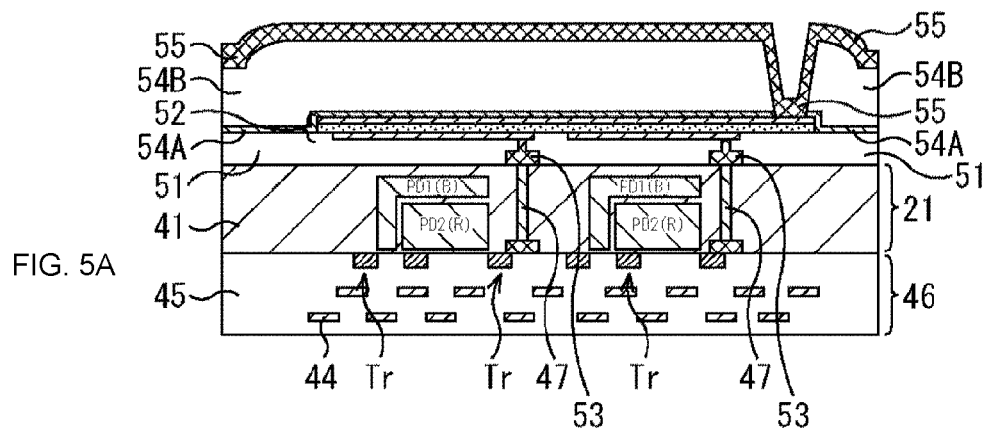
FIGS. 5A, 5B, and 5C are diagrams for explaining a method of manufacturing the solid-state imaging device according to the first embodiment.

Next, as shown in FIG. 5A, the light shielding film 55 is formed by a sputtering method or a CVD method, for example, so as to cover the upper surface of the second sealing film 54B including the opening portion through which the upper electrode 61 is exposed. For example, tungsten (W) is used as the material of the light shielding film 55.

Figure 5B:
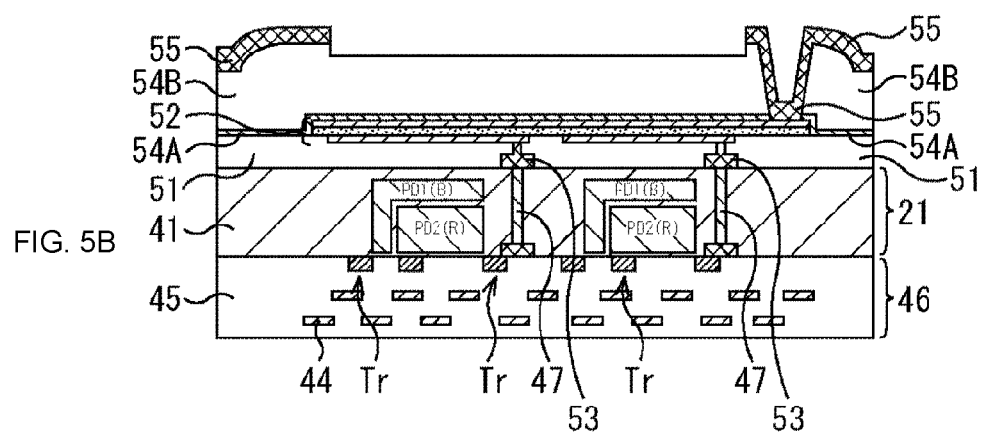

Next, of the light shielding film 55 formed on the entire planar regions of the pixel array unit 3 and the peripheral circuit unit 4, as shown in FIG. 5B, the light shielding film 55 in the region of the pixel array unit 3 is removed by etching, together with part of the second sealing film 54B located under the light shielding film 55.

Figure 5C:
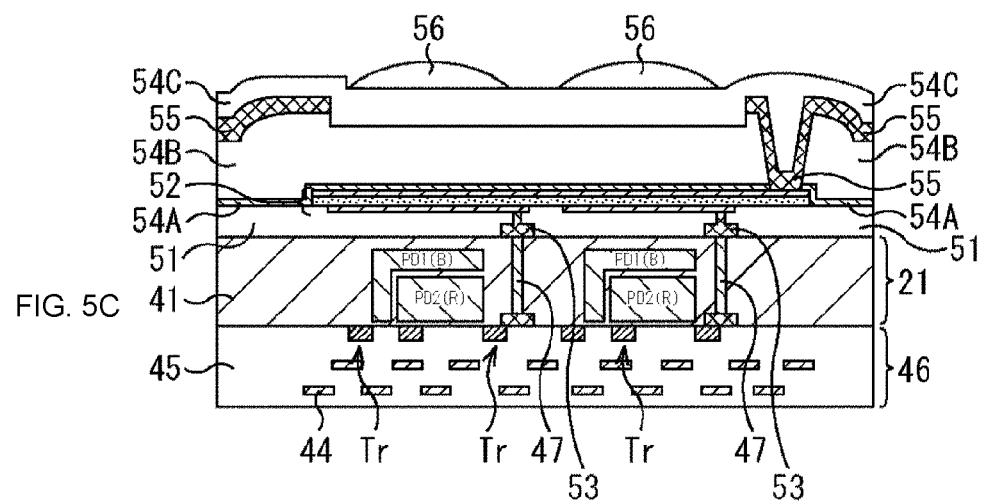

Next, as shown in FIG. 5C, the third sealing film 54C is formed on the entire planar regions of the pixel array unit 3 and the peripheral circuit unit 4 by a CVD method other than the remote plasma CVD method, for example, and an on-chip lens 56 is formed for each pixel on the upper surface of the formed third sealing film 54C in the region of the pixel array unit 3. Thus, the solid-state imaging device 1 shown in FIG. 2 is completed.

Figure 6A:
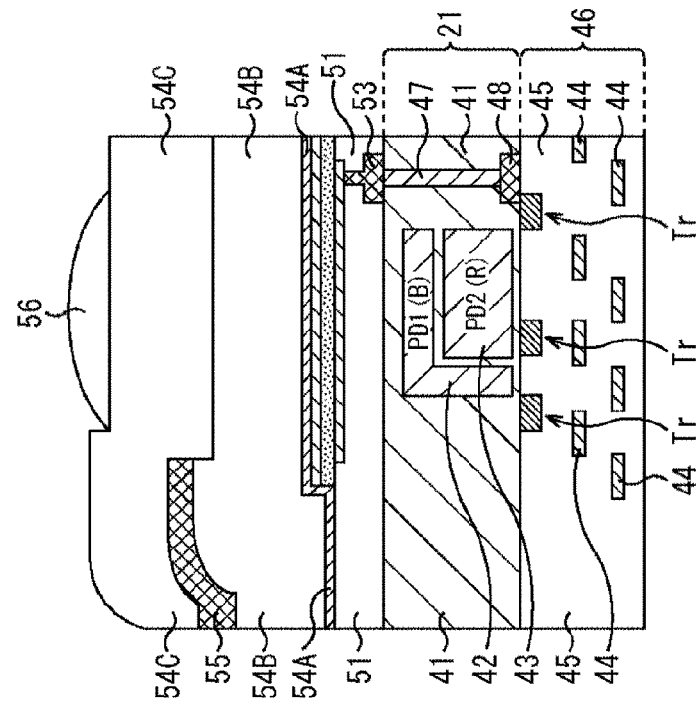
FIGS. 6A and 6B are diagrams for explaining the effects of a first sealing film.
Figure 6B:
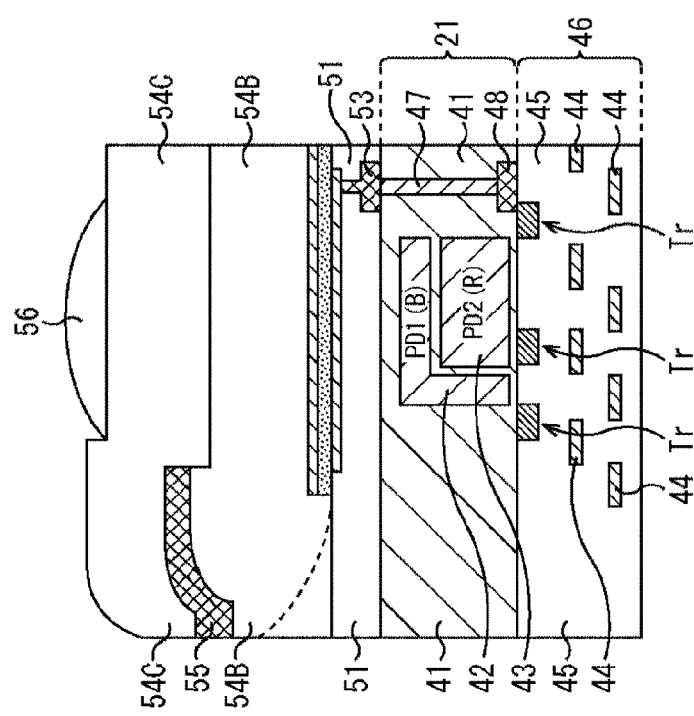

Referring now to FIGS. 6A and 6B, the effects of the first sealing film 54A are described.

For example, as shown in A FIG. 6A, in a case where the first sealing film 54A is not provided, and the second sealing film 54B is formed by a CVD method or a PVD method other than the remote plasma CVD method, a seam as indicated by a dashed line occurs at the step between the upper electrode 61 and the photoelectric conversion film 62, and the transparent insulating film 51.

In the solid-state imaging device 1 according to the first embodiment, on the other hand, as shown in FIG. 6B, silicon carbide oxide as the first sealing film 54A is formed by the remote plasma CVD method, before the second sealing film 54B is formed. The silicon carbide oxide film formed by the remote plasma CVD method has good coverage, and accordingly, any seam is not formed at any step portion. Thus, entry of water molecules and the like from the outside can be effectively prevented. Furthermore, compared to the CVD and ALD methods using plasma other than the remote plasma CVD method, the remote plasma CVD method involves smaller irradiation amounts of high energy charged species (ions, electrons) and UV light, and can perform processes not using any oxidizing gas. Thus, damage to the photoelectric conversion film 62 can be reduced.

Further, the silicon carbide oxide has a refractive index similar to that of the silicon nitride as the second sealing film 54B. Accordingly, it is also possible to prevent optical reflection due to a refractive index difference from the second sealing film 54B.

Furthermore, the first sealing film 54A is also formed so as to cover the side surfaces (side walls) of the end portions of the photoelectric conversion film 62. Accordingly, it is possible to protect not only the upper surface of the upper electrode 61 but also the side surfaces of the end portions of the photoelectric conversion film 62.

Thus, in the solid-state imaging device 1 according to the first embodiment, it is possible to protect the photoelectric conversion film 62 with the first sealing film 54A that has excellent sealing properties and coverage. This makes it possible to prevent deterioration of performance of the photoelectric conversion film 62.

3. Second Embodiment of a Solid-State Imaging Device

Figure 7:
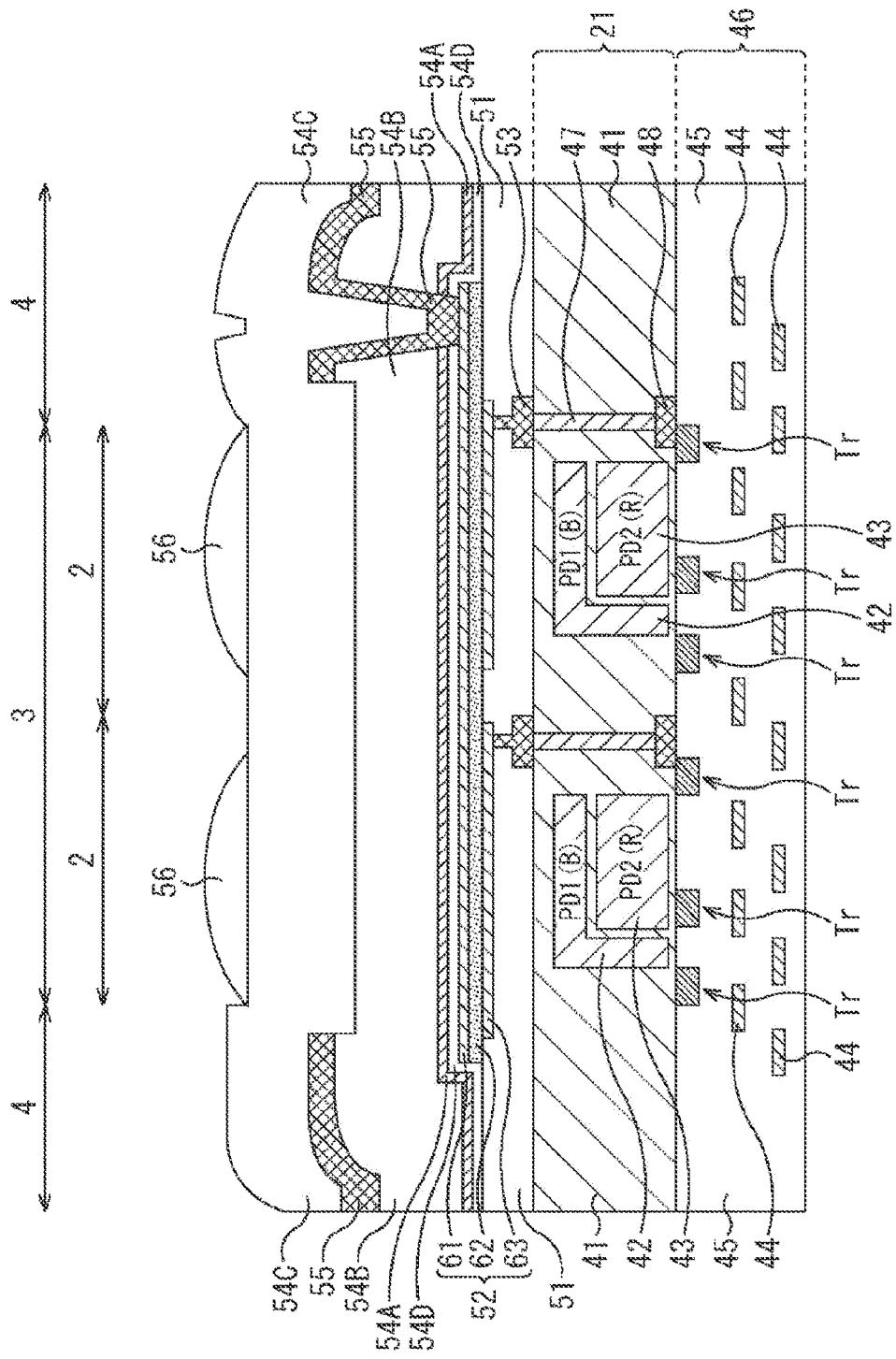
FIG. 7 is a diagram showing an example cross-sectional configuration according to a second embodiment of a solid-state imaging device.

FIG. 7 is a diagram showing an example cross-sectional configuration according to a second embodiment of a solid-state imaging device 1.

Note that, in FIG. 7, the components equivalent to those of the first embodiment shown in FIG. 2 are denoted by the same reference numerals as those used in FIG. 2, and explanation of them will not be unnecessarily repeated.

In the above described first embodiment, the first sealing film 54A is formed directly on the upper electrode 61. In the second embodiment shown in FIG. 7, on the other hand, a fourth sealing film 54D using s different material from the first sealing film 54A is formed on the upper side of the upper electrode 61 of the pixel array unit 3 and the upper side of the transparent insulating film 51 of the peripheral circuit unit 4, for example, and the first sealing film 54A is formed on the fourth sealing film 54D by a remote plasma CVD method. This aspect differs from the first embodiment. Silicon nitride or the like that is the same material as the second sealing film 54B can be used as the material of the fourth sealing film 54D, for example. The film thickness of the fourth sealing film 54D can be about 50 nm, for example.

As described above, the fourth sealing film 54D including a different material from the first sealing film 54A may be formed before the first sealing film 54A is formed by the remote plasma CVD method. As a result, it is possible to prevent film peeling at the interface between the first sealing film 54A and the transparent insulating film 51, and at the interface between the first sealing film 54A and the upper electrode 61.

In other words, in a case where there is concern for the adhesiveness of the first sealing film 54A, the fourth sealing film 54D formed with a material having high adhesiveness is formed before the first sealing film 54A is formed, as in the second embodiment. In a case where the first sealing film 54A has sufficient adhesiveness, the first sealing film 54A having excellent sealing properties and coverage are formed directly on the upper electrode 61 and the transparent insulating film 51 as in the first embodiment. Note that, in a case where the first sealing film 54A is directly formed on the upper electrode 61 and the transparent insulating film 51, a protective film that prevents damage to the photoelectric conversion film 62 and absorbs ultraviolet light generated during processing may be formed on the upper surface of the upper electrode 61.

In the second embodiment described above, the first sealing film 54A formed with silicon carbide oxide by the remote plasma CVD method is also provided, so that the photoelectric conversion film 62 can be protected, and performance degradation can be prevented.

4. Third Embodiment of a Solid-State Imaging Device

Figure 8:
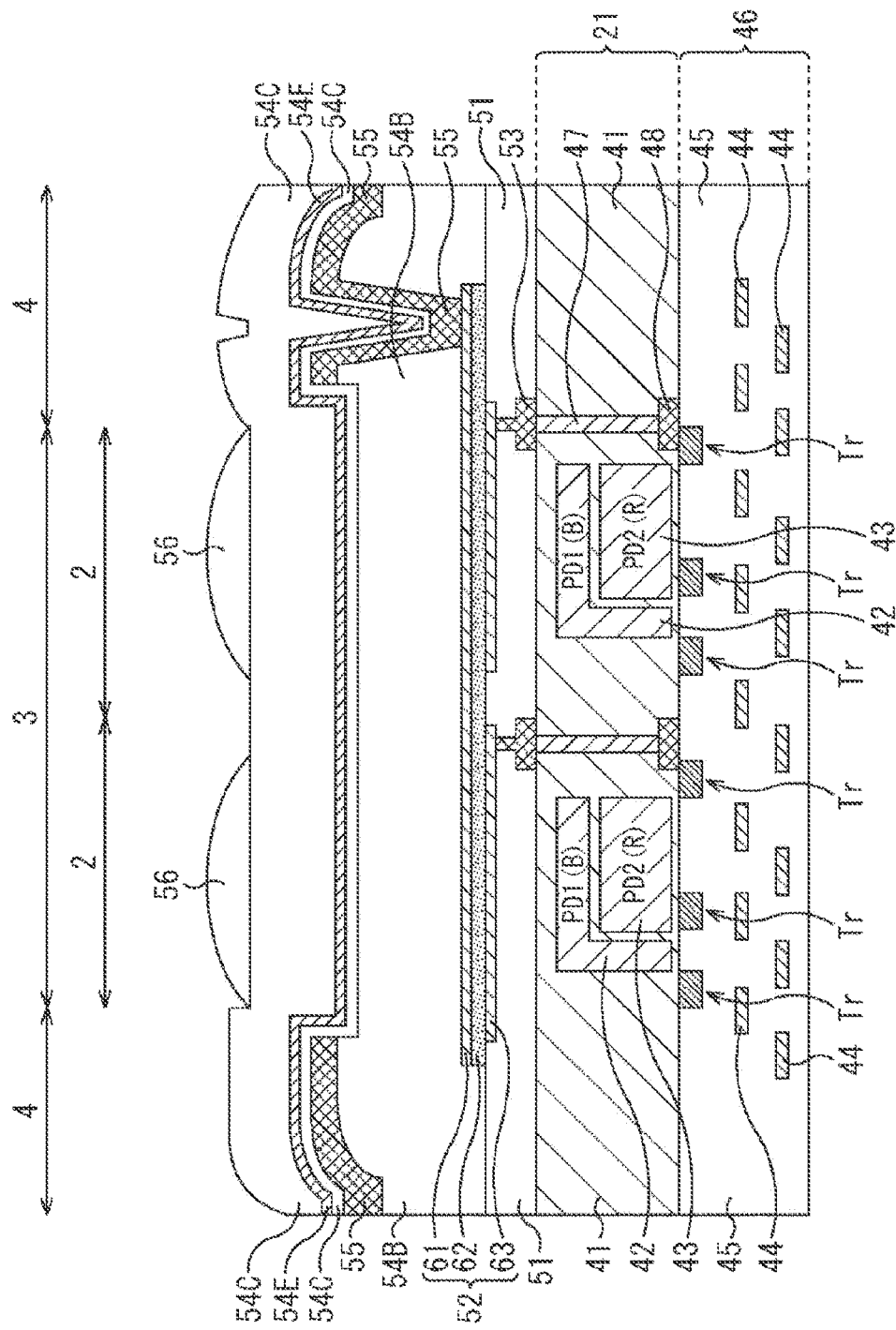
FIG. 8 is a diagram showing an example cross-sectional configuration according to a third embodiment of a solid-state imaging device.

FIG. 8 is a diagram showing an example cross-sectional configuration according to a third embodiment of a solid-state imaging device 1.

Note that, in FIG. 8, the components equivalent to those of the first embodiment shown in FIG. 2 are also denoted by the same reference numerals as those used in FIG. 2, and explanation of them will not be unnecessarily repeated.

In the third embodiment shown in FIG. 8, the first sealing film 54A formed so as to cover the upper electrode 61 and the photoelectric conversion film 62 in the first embodiment shown in FIG. 2 is not provided.

Instead, a fifth sealing film 54E is newly formed above the second sealing film 54B and the light shielding film 55. Like the first sealing film 54A, the fifth sealing film 54E is formed with a silicon carbide oxide film formed by a remote plasma CVD method, for example. Note that the fifth sealing film 54E may be formed with a material other than silicon carbide oxide, and be formed with a silicon carbide nitride film, a silicon nitride film, a silicon carbide nitride film, an aluminum oxide film, an aluminum nitride film, or the like formed by the remote plasma CVD method, as in the first embodiment.

If a silicon nitride (SiN) film or the like is formed by a CVD method or a PVD method other than the remote plasma CVD method in a situation where a step is formed, a seam is formed, and therefore, there is a possibility that a seam is also formed in the third sealing film 54C due to the step formed by the light shielding film 55 of the peripheral circuit unit 4. The fifth sealing film 54E can cancel the seam formed by the step caused by the light shielding film 55.

Note that the first sealing film 54A is not provided in the example shown in FIG. 8, but a structure that includes both the first sealing film 54A and the fifth sealing film 54E, instead of not including the first sealing film 54A, may be formed as the solid-state imaging device 1 according to the third embodiment.

Further, in the example shown in FIG. 8, the fifth sealing film 54E is formed, with the third sealing film 54C as thin as about 50 nm being left under the fifth sealing film 54E. Like the fourth sealing film 54D of the second embodiment, this thin third sealing film 54C aims to prevent peeling of the fifth sealing film 54E from the light shielding film 55 and the like. However, in a case where the adhesiveness of the fifth sealing film 54E is sufficient, the fifth sealing film 54E can be formed directly on the second sealing film 54B and the light shielding film 55.

5. Fourth Embodiment of a Solid-State Imaging Device

Figure 9:
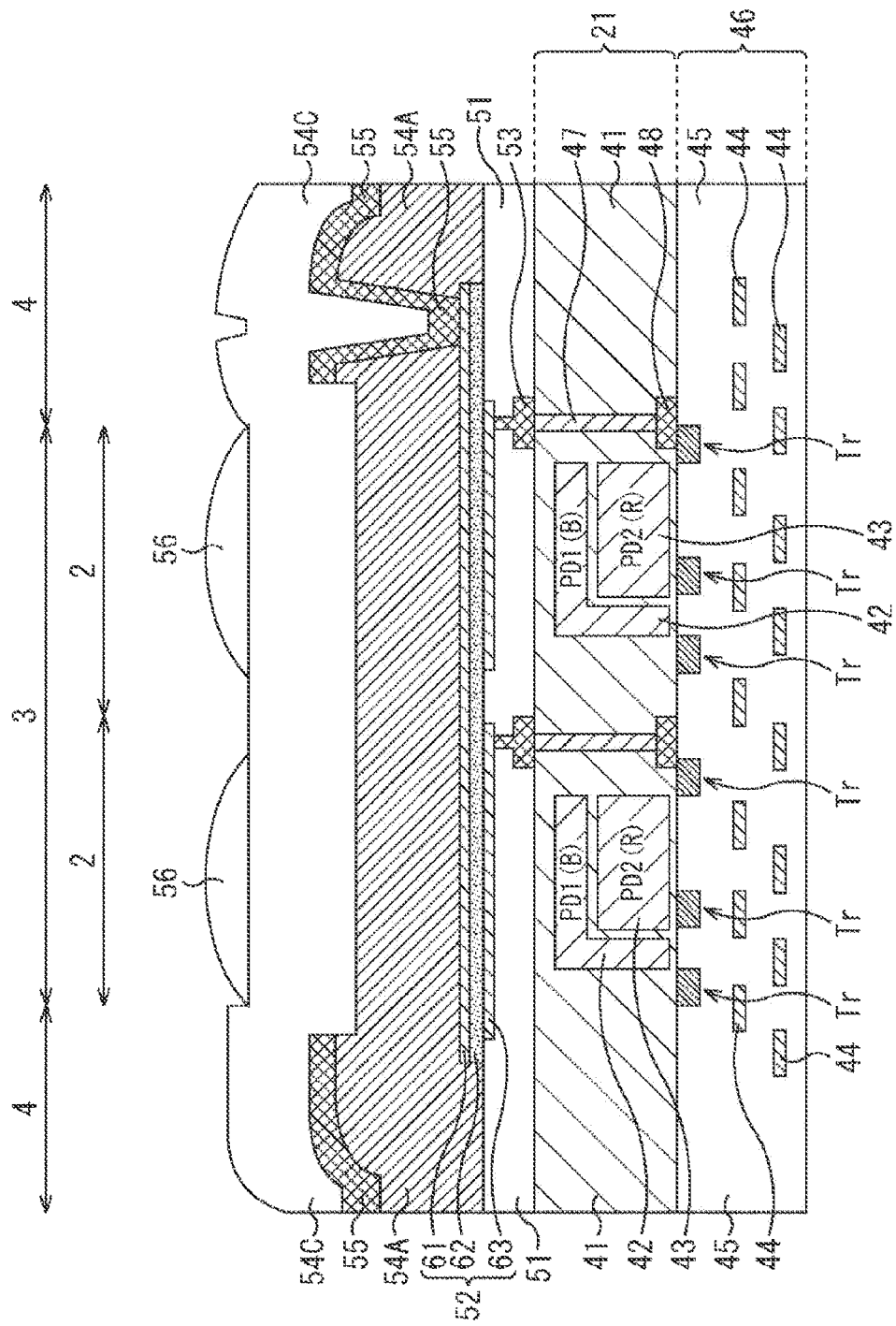
FIG. 9 is a diagram showing an example cross-sectional configuration according to a fourth embodiment of the solid-state imaging device.

FIG. 9 is a diagram showing an example cross-sectional configuration according to a fourth embodiment of the solid-state imaging device 1.

Note that, in FIG. 9, the components equivalent to those of the first embodiment shown in FIG. 2 are also denoted by the same reference numerals as those used in FIG. 2, and explanation of them will not be unnecessarily repeated.

In the fourth embodiment shown in FIG. 9, the portions of the first sealing film 54A and the second sealing film 54B in the first embodiment are replaced with a first sealing film 54A formed by a remote plasma CVD method. The other aspects of the fourth embodiment are similar to those of the first embodiment.

In the fourth embodiment as described above, it is possible to prevent formation of seams by virtue of the first sealing film 54A formed by the remote plasma CVD method, and reduce damage to the photoelectric conversion film 62. Further, sealing properties can be improved, and the photoelectric conversion film 62 can be protected.

Note that, in the structure shown in FIG. 9, the third sealing film 54C is formed above the light shielding film 55 by a film forming method other than the remote plasma CVD method, as in the first embodiment described above. However, the region of the third sealing film 54C may also be replaced with the first sealing film 54A formed by the remote plasma CVD method.

6. Example Applications to Electronic Apparatuses

The present technology is not only applied to solid-state imaging devices. Specifically, the present technology can be applied to any electronic apparatus using a solid-state imaging device as an image capturing unit (a photoelectric conversion unit), such as an imaging apparatus like a digital still camera, a video camera, or the like, a mobile terminal device having an imaging function, or a copying machine using a solid-state imaging device as the image reader. A solid-state imaging device may be in the form of a single chip, or may be in the form of a module that is formed by packaging an imaging unit and a signal processing unit or an optical system, and have an imaging function.

Figure 10:
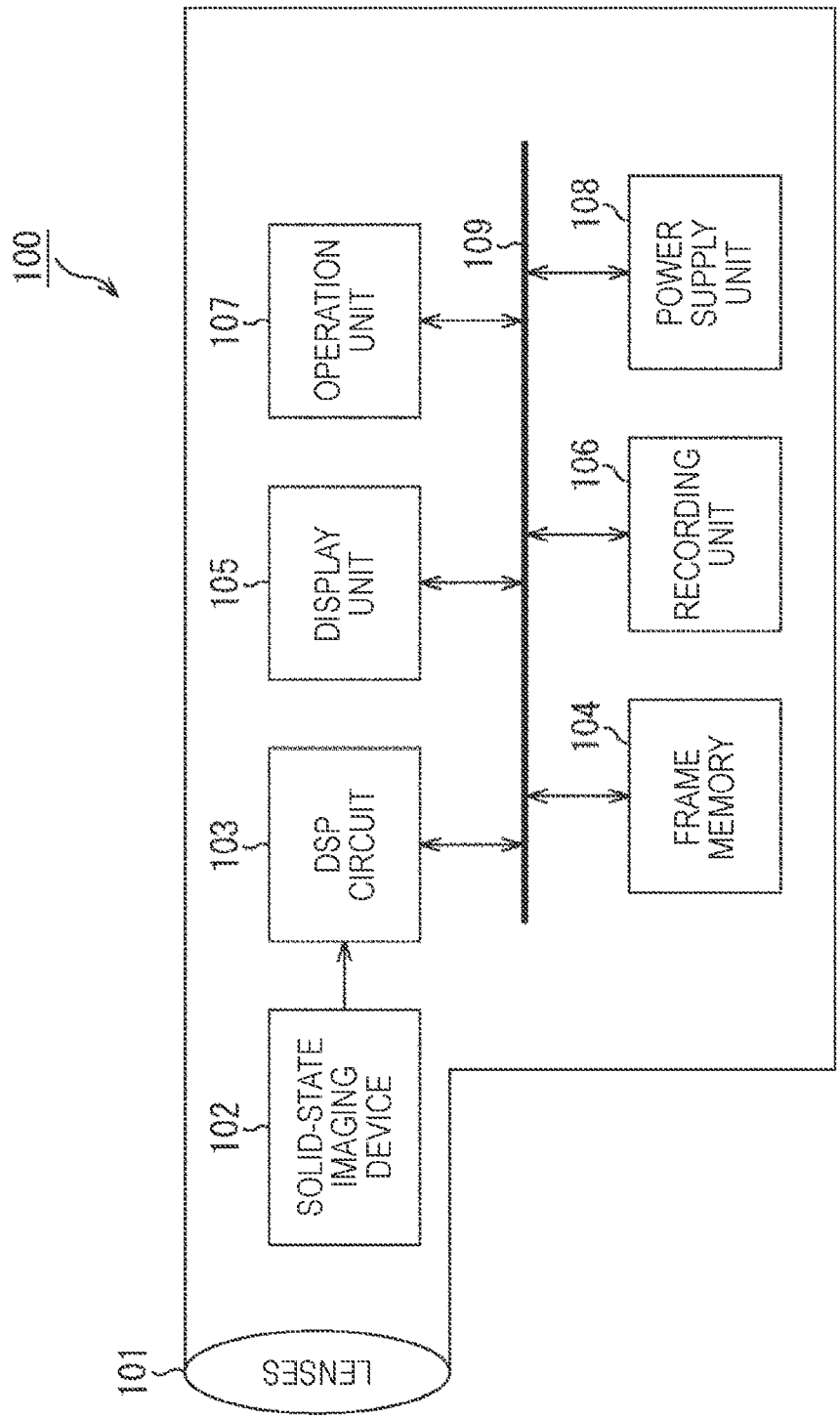
FIG. 10 is a block diagram showing an example configuration of an imaging apparatus as an electronic apparatus to which the present technology is applied.

FIG. 10 is a block diagram showing an example configuration of an imaging apparatus as an electronic apparatus to which the present technology is applied.

The imaging apparatus 100 shown in FIG. 10 includes an optical unit 101 formed with lenses and the like, a solid-state imaging device (an imaging device) 102 having the configuration of the solid-state imaging device 1 shown in FIG. 1, and a digital signal processor (DSP) circuit 103 that is a camera signal processor circuit. The imaging apparatus 100 further includes a frame memory 104, a display unit 105, a recording unit 106, an operation unit 107, and a power supply unit 108. The DSP circuit 103, the frame memory 104, the display unit 105, the recording unit 106, the operation unit 107, and the power supply unit 108 are connected to one another via a bus line 109.

The optical unit 101 gathers incident light (image light) from an object, and forms an image on the imaging surface of the solid-state imaging device 102. The solid-state imaging device 102 converts the amount of the incident light, which has been gathered as the image on the imaging surface by the optical unit 101, into an electrical signal for each pixel, and outputs the electrical signal as a pixel signal. The solid-state imaging device 102 can be the solid-state imaging device 1 shown in FIG. 1, which is a solid-state imaging device that includes at least one of the first sealing film 54A and the fifth sealing film 54E formed with silicon carbide oxide (SiCO) or the like by a remote plasma CVD method, and has excellent sealing properties and coverage.

The display unit 105 is formed with a flat-panel display such as a liquid crystal display (LCD) or an organic electroluminescence (EL) display, for example, and displays a moving image or a still image formed by the solid-state imaging device 102. The recording unit 106 records the moving image or the still image formed by the solid-state imaging device 102 into a recording medium such as a hard disk or a semiconductor memory.

When operated by a user, the operation unit 107 issues operating instructions as to various functions of the imaging apparatus 100. The power supply unit 108 supplies various power sources as the operation power sources for the DSP circuit 103, the frame memory 104, the display unit 105, the recording unit 106, and the operation unit 107, as appropriate.

As described above, the solid-state imaging device 1 according to any of the above described embodiments or a combination thereof or a modification thereof is used as the solid-state imaging device 102, so that formation of a seam can be prevented, and damage due to moisture, oxygen, or the like can be reduced. Accordingly, the quality of captured images can also be increased in the imaging apparatus 100, which is a video camera, a digital still camera, a cameral module for mobile devices such as portable telephone devices, or the like.

Examples of Use as an Image Sensor

Figure 11:
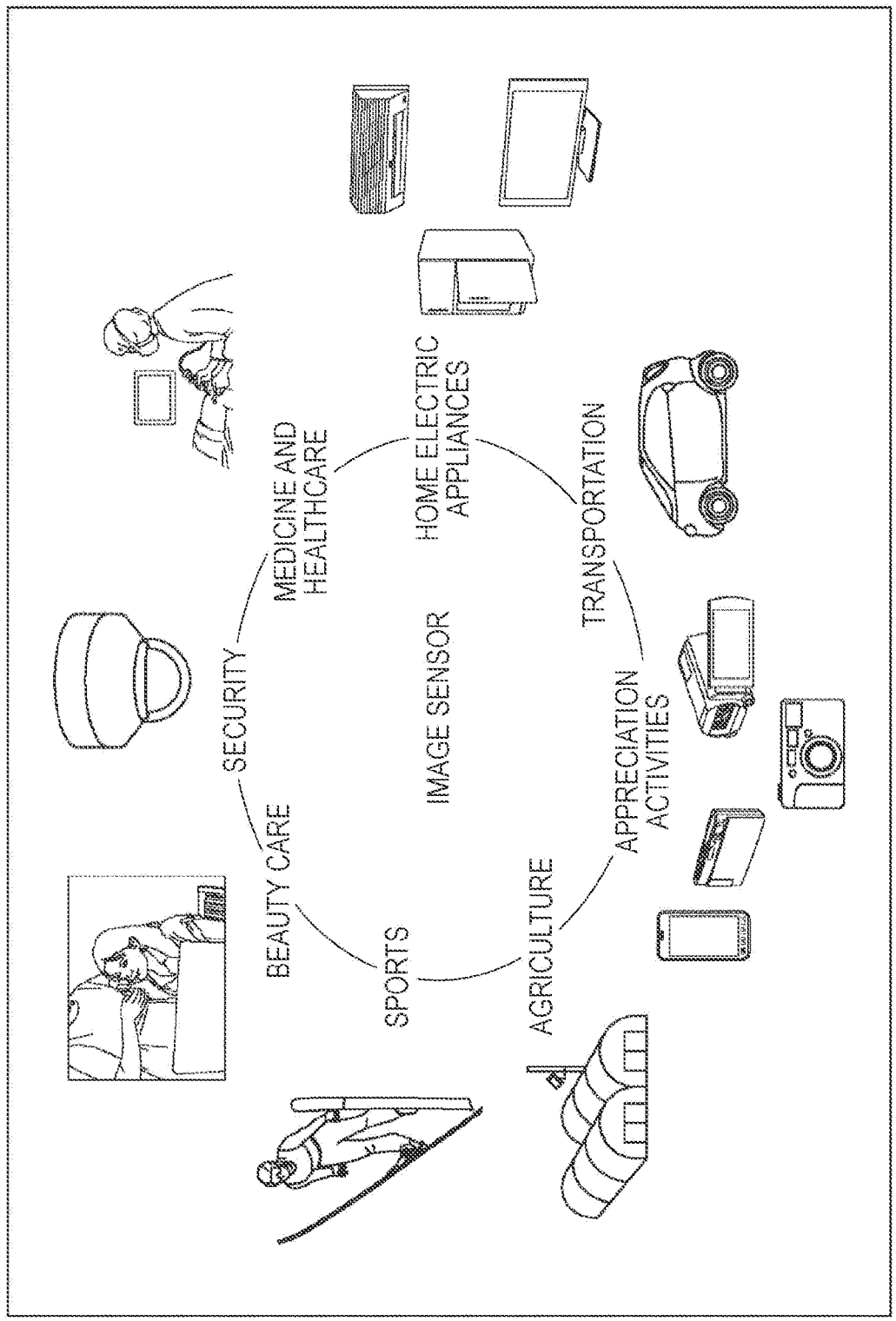
FIG. 11 is a diagram showing examples of use of the above described solid-state imaging device as an image sensor.

FIG. 11 is a diagram showing examples of use of the above described solid-state imaging device 1 as an image sensor.

An image sensor that uses the above described solid-state imaging device 1 can be used in various cases where light, such as visible light, infrared light, ultraviolet light, or X-rays, is to be sensed, as listed below, for example.

Devices configured to take images for appreciation activities, such as digital cameras and portable devices with camera functions.

Devices for transportation use, such as vehicle-mounted sensors configured to take images of the front, the back, the surroundings, the inside and the like of an automobile to perform safe driving such as an automatic stop, recognize a driver's condition and the like, surveillance cameras for monitoring running vehicles and roads, and ranging sensors for measuring distances between vehicles or the like.

Devices to be used in conjunction with home electric appliances, such as television sets, refrigerators, and air conditioners, to take images of gestures of users and operate the appliances in accordance with the gestures.

Devices for medical care use and health care use, such as endoscopes and devices for receiving infrared light for angiography.

Devices for security use, such as surveillance cameras for crime prevention and cameras for personal authentication.

Devices for beauty care use, such as skin measurement devices configured to take images of the skin and microscopes for imaging the scalp.

Devices for sporting use, such as action cameras and wearable cameras for sports and the like.

Devices for agricultural use such as cameras for monitoring conditions of fields and crops.

Embodiments of the present technology are not limited to the above described embodiments, and various changes can be made to them without departing from the scope of the present technology.

For example, it is possible to adopt an embodiment that combines all or some of the above embodiments.

Alternatively, the above described solid-state imaging device 1 is a vertical spectroscopic solid-state imaging device that photoelectrically converts green light with the photoelectric conversion unit 52 formed outside the semiconductor substrate 21, and photoelectrically converts blue and red with the photodiodes PD1 and PD2 in the semiconductor substrate 21, for example. Instead of such a vertical spectroscopic solid-state imaging device, the solid-state imaging device 1 can also adopt a configuration in which a so-called panchromatic film having sensitivity over the entire wavelength range of visible light is used as the photoelectric conversion film 62, and color filters in the Bayer array or the like are formed above the photoelectric conversion film 62. In this case, the photodiodes PD1 and PD2 are not formed in the semiconductor substrate 21, and accordingly, the lower electrode 63 can be formed with a metal such as aluminum, vanadium, gold, silver, platinum, iron, cobalt, carbon, nickel, tungsten, palladium, magnesium, calcium, tin, lead, titanium, yttrium, lithium, ruthenium, or manganese, or an alloy of some of those alloys, for example.

Also, in the above described solid-state imaging device 1, the photoelectric conversion unit 52 formed outside the semiconductor substrate 21 photoelectrically converts green light. However, the photoelectric conversion unit 52 may be designed to photoelectrically convert light of wavelength of some other color. In other words, in the vertical spectroscopic solid-state imaging device 1, three photoelectric conversion units may exchange light of wavelength as appropriate.

The material in a case where the photoelectric conversion unit 52 is formed with a photoelectric conversion film 62 having sensitivity only to red can be a combination of organic materials including a phthalocyanine compound (an electron-donating material) and a fluorine-substituted phthalocyanine compound (an electron-accepting material), for example.

The material in a case where the photoelectric conversion unit 52 is formed with a photoelectric conversion film 62 having sensitivity only to blue can be a combination of organic materials including a coumarin compound (an electron-donating material) and a silole compound (an electron-accepting material), for example.

Alternatively, instead of an organic photoelectric conversion material, an inorganic photoelectric conversion material may be adopted as the material of the photoelectric conversion film 62. Examples of such inorganic photoelectric conversion materials include crystalline silicon, amorphous silicon, CIGS (Cu, In, Ga, and Se compounds), CIS (Cu, In, and Se compounds), chalcopyrite structured semiconductors, compound semiconductors such as GaAs.

In the solid-state imaging device 1, not only the photoelectric conversion film 62 that photoelectrically converts green light but also a photoelectric conversion film that photoelectrically converts blue and red light may be provided on the upper side (the outer side) of the semiconductor substrate 21.

In the above described examples, a back-illuminated pixel structure is adopted as the solid-state imaging device 1. However, the present technology can also be applied to surface-illuminated solid-state imaging devices.

In the above described examples, the solid-state imaging device 1 is formed with a single semiconductor substrate 21, but the solid-state imaging device 1 may be formed with a stack structure of two or three semiconductor substrates.

In the solid-state imaging devices of the above described examples, the first conductivity type of the semiconductor substrate 21 is the P-type, the second conductivity type is the N-type, and electrons are used as signal charges. However, the present technology can also be applied to solid-state imaging devices in which holes are used as signal charges. In other words, the first conductivity type can be the N-type, the second conductivity type can be the P-type, and the conductivity types of the above described respective semiconductor regions can be reversed.

The present technology can be applied not only to solid-state imaging devices that sense an incident light quantity distribution of visible light and form an image in accordance with the distribution, but also to solid-state imaging devices (physical quantity distribution sensors) in general, such as a solid-state imaging device that senses an incident quantity distribution of infrared rays, X-rays, particles, or the like, and forms an image in accordance with the distribution, or a fingerprint sensor that senses a distribution of some other physical quantity in a broad sense, such as pressure or capacitance, and forms an image in accordance with the distribution.

Furthermore, the present technology can be applied not only to solid-state imaging devices but also to semiconductor devices having other semiconductor integrated circuits in general.

Note that the advantageous effects described in this specification are merely examples, and the advantageous effects of the present technology are not limited to them and may include effects other than those described in this specification.

Note that the present technology can also be configured as follows.

(1)

A solid-state imaging device including:

a photoelectric conversion film formed on an upper side of a semiconductor substrate; and a first sealing film that is formed on an upper layer of the photoelectric conversion film and has a lower etching rate than an etching rate of silicon oxide.

(2)

The solid-state imaging device according to (1), in which the first sealing film is formed on a second sealing film of a different material.

(3)

The solid-state imaging device according to (2), in which the second sealing film also functions as a peeling prevention film that prevents peeling of the photoelectric conversion film.

(4)

The solid-state imaging device according to (1), in which the first sealing film is formed on an upper layer of a light shielding film via a second sealing film of a different material.

(5)

The solid-state imaging device according to (1), in which the first sealing film is formed directly on a light shielding film.

(6)

The solid-state imaging device according to (1), in which the first sealing film is formed to cover a side surface of an end portion of the photoelectric conversion film.

(7)

The solid-state imaging device according to (1), further including a second sealing film that is formed on an upper layer of a light shielding film and has a lower etching rate than an etching rate of silicon oxide.

(8)

The solid-state imaging device according to any of (1) to (7), in which the first sealing film is formed with silicon carbide oxide.

(9)

The solid-state imaging device according to any of (1) to (8), in which the photoelectric conversion film is an organic photoelectric conversion film using an organic material.

(10)

A method of manufacturing a solid-state imaging device, including:

forming a photoelectric conversion film on an upper side of a semiconductor substrate; and forming a sealing film on an upper layer of the photoelectric conversion film by a remote plasma CVD method.

(11)

An electronic apparatus including a solid-state imaging device including:

a photoelectric conversion film formed on an upper side of a semiconductor substrate; and a sealing film that is formed on an upper layer of the photoelectric conversion film and has a lower etching rate than an etching rate of silicon oxide.

REFERENCE SIGNS LIST

1 Solid-state imaging device
2 Pixel
3 Pixel array unit
21 Semiconductor substrate
51 Transparent insulating film
52 Photoelectric conversion unit
54A First sealing film
54B Second sealing film
54C Third sealing film
54D Fourth sealing film
54E Fifth sealing film
55 Light shielding film
61 Upper electrode
62 Photoelectric conversion film
63 Lower electrode
100 Imaging apparatus
102 Solid-state imaging device

The invention claimed is:

1. A solid-state imaging device, comprising:
   a semiconductor substrate;
   a photoelectric conversion film on an upper side of the semiconductor substrate;
   a first sealing film above the photoelectric conversion film;
   a second sealing film above the first sealing film, wherein the second sealing film includes a first layer and a second layer;
   a third sealing film between the first sealing film and the second sealing film, wherein
      the first layer of the second sealing film is under the third sealing film,
      the second layer of the second sealing film is on the third sealing film,
      the first layer of the second sealing film covers an entire lower surface of the third sealing film,
      the second layer of the second sealing film covers an entire upper surface of the third sealing film,
      the first layer of the second sealing film is on the first sealing film, and
      the first layer of the second sealing film is thinner than the second layer of the second sealing film; and
   a light shielding film between the first sealing film and the first layer of the second sealing film, wherein
      the light shielding film is on the first sealing film, and
      each of the first layer of the second sealing film, the second layer of the second sealing film, and the third sealing film is on the light shielding film.

2. The solid-state imaging device according to claim 1, further comprising a fourth sealing film, wherein the first sealing film is on the fourth sealing film.

3. The solid-state imaging device according to claim 2, further comprising a fifth sealing film below the fourth sealing film, wherein
   the fifth sealing film is a peeling prevention film that prevent a peeling process of the photoelectric conversion film, and
   a material of the fifth sealing film is different from a material of the fourth sealing film.

4. The solid-state imaging device according to claim 2, wherein the fourth sealing film comprises silicon carbide oxide.

5. The solid-state imaging device according to claim 1, wherein the second sealing film is on an upper layer of the light shielding film via the first sealing film.

6. The solid-state imaging device according to claim 1, wherein the second sealing film is directly on the light shielding film.

7. The solid-state imaging device according to claim 1, further comprising a fourth sealing film that is below the first sealing film, wherein the fourth sealing film covers a side surface of an end portion of the photoelectric conversion film.

8. The solid-state imaging device according to claim 1, wherein
   the first sealing film is on a lower side of the light shielding film, and
   an etching rate of the first sealing film is higher than an etching rate of silicon oxide.

9. The solid-state imaging device according to claim 1, wherein the photoelectric conversion film is an organic photoelectric conversion film that comprises an organic material.

10. The solid-state imaging device according to claim 1, further comprising:
    a fourth sealing film that is below the first sealing film; and
    an electrode on the photoelectric conversion film, wherein
       the fourth sealing film is on the electrode,
       the fourth sealing film covers a side surface of an end portion of the photoelectric conversion film,
       the fourth sealing film comprises an opening portion that exposes the electrode,
       the light shielding film is on the fourth sealing film, and
       the light shielding film is in contact with a portion of the electrode in the opening portion of the fourth sealing film.

11. An electronic apparatus, comprising:
    a solid-state imaging device including:
       a semiconductor substrate;
       a photoelectric conversion film on an upper side of the semiconductor substrate;
       a first sealing film above the photoelectric conversion film;
       a second sealing film above the first sealing film, wherein the second sealing film includes a first layer and a second layer;
       a third sealing film between the first sealing film and the second sealing film, wherein
          the first layer of the second sealing film is under the third sealing film,
          the second layer of the second sealing film is on the third sealing film,
          the first layer of the second sealing film covers an entire lower surface of the third sealing film,
          the second layer of the second sealing film covers an entire upper surface of the third sealing film,
          the first layer of the second sealing film is on the first sealing film, and
          the first layer of the second sealing film is thinner than the second layer of the second sealing film; and
       a light shielding film between the first sealing film and the first layer of the second sealing film, wherein
          the light shielding film is on the first sealing film, and
          each of the first layer of the second sealing film, the second layer of the second sealing film, and the third sealing film is on the light shielding film.

* * * * *